United States Patent [19]
Caldwell et al.

[11] Patent Number: 5,736,680
[45] Date of Patent: Apr. 7, 1998

[54] POLYMORPHIC RECTILINEAR THIEVING PAD

[75] Inventors: Barry E. Caldwell, Whitewater; Raymond S. Rowhuff, Valley Center, both of Kans.

[73] Assignee: Symbios Logic Inc., Fort Collins, Colo.

[21] Appl. No.: 781,992

[22] Filed: Jan. 6, 1997

Related U.S. Application Data

[63] Continuation of Ser. No. 469,293, Jun. 6, 1995, abandoned.

[51] Int. Cl.$^6$ .................................................. H05K 1/00
[52] U.S. Cl. .................................. 174/250; 228/180.1
[58] Field of Search ........................ 361/767, 768, 361/774, 777, 760, 779, 783; 174/261, 260, 250, 262; 228/180.21, 180.22, 180.1, 189.1; 439/83; 257/723, 724, 738, 778, 786

[56] References Cited

U.S. PATENT DOCUMENTS

| | | | |
|---|---|---|---|
| 3,567,844 | 3/1971 | Kremar | 174/68.5 |
| 4,225,900 | 9/1980 | Ciccio et al. | 361/395 |
| 4,339,784 | 7/1982 | Shearer | 361/403 |
| 4,438,560 | 3/1984 | Kisters | 29/830 |
| 4,543,715 | 10/1985 | Iadorola et al. | 29/852 |
| 4,835,345 | 5/1989 | Haarde | 174/68.5 |
| 4,851,614 | 7/1989 | Duncan, Jr. | 174/68.5 |
| 4,891,472 | 1/1990 | Veurman et al. | 174/68.5 |
| 4,893,216 | 1/1990 | Hagner | 361/406 |
| 5,067,042 | 11/1991 | Nagano | 361/406 |
| 5,227,589 | 7/1993 | Weeks | 174/263 |
| 5,242,100 | 9/1993 | Weeks | 228/180.1 |
| 5,243,143 | 9/1993 | Throop et al. | 174/263 |
| 5,414,223 | 5/1995 | Suski et al. | 174/262 |

FOREIGN PATENT DOCUMENTS

| | | | |
|---|---|---|---|
| 1101695 | 4/1989 | Japan | H05K 3/34 |
| 1300588 | 12/1989 | Japan | H05K 3/34 |

*Primary Examiner*—Kristine L. Kincaid
*Assistant Examiner*—Kamand Cuneo
*Attorney, Agent, or Firm*—David K. Lucente; Duke W. Yee

[57] ABSTRACT

A pad is adjacent a hole that will be located on the trailing edge of the board when the board is processed through wave soldering. The pad includes a curved side that faces the hole. In addition, corners are absent from the pad. The intersections of sides of the pad occurs as a curve or radiused corner, rather than a verticed corner. Wave soldering the printed circuit board with the pad greatly reduces bridging of a lead inserted into the hole adjacent the pad.

28 Claims, 4 Drawing Sheets

POLYMORPHIC RECTILINEAR THIEVING PAD

This is a continuation of application Ser. No. 08/469,293 filed Jun. 6, 1995, now abandoned.

BACKGROUND OF THE INVENTION

1. Technical Field

The present invention relates generally to printed circuit boards for electronic devices and more particularly to a method and apparatus for minimizing bridging across pin-in-hole leads of integrated circuits and connectors during soldering. Still more particularly, the present invention relates to a method and apparatus for minimizing bridging across the leads of integrated circuits and connectors during soldering through the use of unique solder pad shapes.

2. Description of the Related Art

The processing of the printed circuit boards generally involves producing a laminated board having an epoxy based substrate with layers of etched copper conductors thereon, and one or more semiconductor chip components or connectors attached to the board by tiny lead wires. A particularly common configuration for these lead wires is a dual in-line pin, commonly called a "DIP package". This configuration appears as two rows of electrical leads projecting from opposite edges of the component and bent at 90°, such that the leads project downward from the plane of the chip.

Chip components are typically mounted to the printed circuit board by inserting the component leads into holes disposed through the board which extend from the component side of the board to the solder side of the board. Surrounding each of these holes on the solder side of the circuit board is a solder pad. A known technique for securing the chip components and connectors to the board by their leads is to mask a portion of the lower side of the board to create a pattern, flux the exposed surfaces, preheat, and then pass the solder side of the board through a wave of molten solder in a process called "wave soldering".

During the wave soldering process, molten solder is pumped up and over support plates to form a wave. The printed circuit board is passed over the solder wave by a conveyer at an angle such that the solder side of the board contacts the leading edge of the solder wave. Component leads are soldered to the solder pads on the printed circuit board and the holes, which are often pre-plated, are filled with solder by capillary action.

If two clean metal surfaces are held together and dipped into the molten solder, the solder will wet the metal and climb up to fill the gaps between the adjacent surfaces. This phenomena is the result of capillary action. Wave soldering processes rely on this phenomena to produce a fillet of solder both on the component side of the circuit board and surrounding the portion of the lead which projects through the holes to the solder side of the circuit board. Unfortunately, however, capillary action can produce unwanted solder "bridging" between closely spaced component leads.

In recent years, the dramatic increase in packaging density of through-hole connectors has led to smaller and smaller lead spacing. At such smaller lead spacings, the problem of bridging, especially on the trailing edge of the leads, can be severe.

The art has been replete with many attempts to alleviate the bridging problem. Process parameters such as wave height, conveyers speed, pre-heat temperatures, flux types, and solder temperatures have all been attempted, but have been unsuccessful. For some components, it is still necessary to manually remove the solder bridges by reheating the connections and removing the excess solder with a vacuum device such as "solder sucker" or with a copper braid which wicks molten solder. These are extremely expensive and time-consuming processes and the required remelting can weaken the solder connections.

Other techniques have also been developed which have proved promising, but have been relatively ineffective in eliminating bridging. For example, additional dummy solder pads, arranged in line with the row of leads have been added to reduce solder bridging between adjacent leads during the soldering operation. The presently used solder pads, however, have not reduced bridging between leads as much as desired.

Therefore, it would be advantageous to have an improved method and apparatus for reducing bridging across leads of integrated circuits during soldering operations.

SUMMARY OF THE INVENTION

The method and apparatus of the present invention provides a printed circuit board having an array of holes for receiving leads of a device, such as, for example, an integrated circuit or a connector. A pad is associated with a hole that will be located on the trailing edge of the board when the board is processed through wave soldering. The pad includes a curved side that faces the hole. In addition, corners are absent from the pad. The intersections of sides of the pad occurs as a curve or radiused corner, rather than a verticed corner. Wave soldering the printed circuit board with the pad greatly reduces bridging of a lead inserted into the hole associated with the pad.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
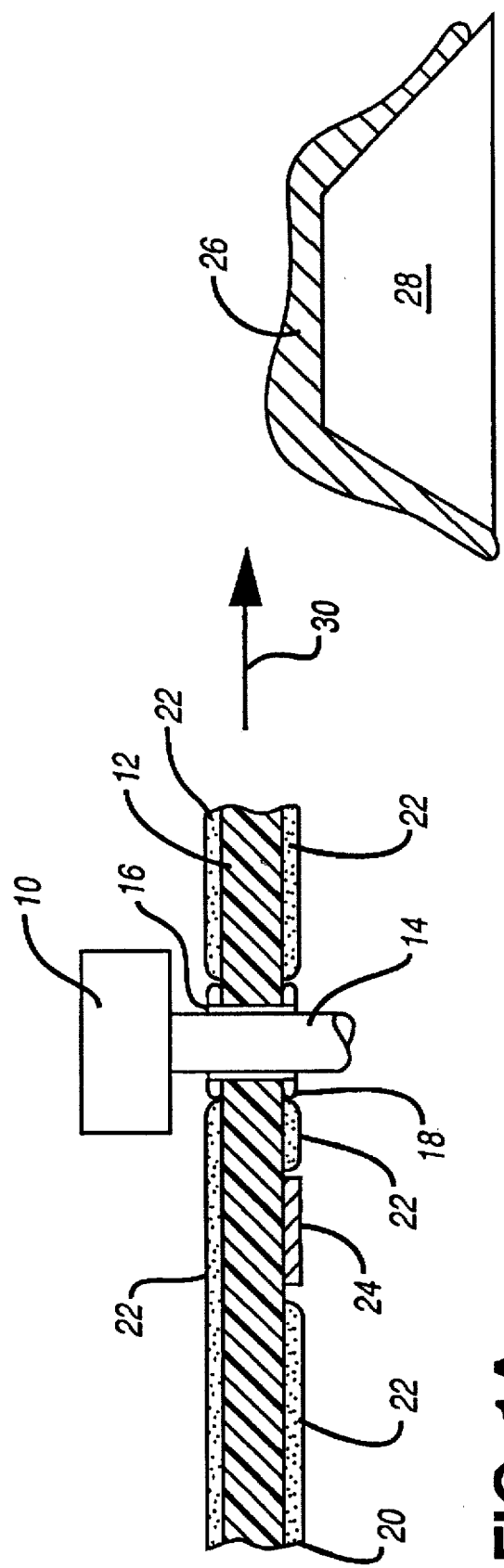
FIG. 1A is a partial cross-sectional side view of a printed circuit board including a polymorphic rectilinear thieving pad according to the present invention prior to contact with a solder wave.
FIG. 1B is a cross section of a support piece that creates a solder wave.

With reference now to the figures, and in particular with reference to FIG. 1, a partial cross-sectional side view of a printed circuit board including a polymorphic rectilinear thieving pad according to the present invention is depicted prior to contacting a solder wave. As can be seen in FIG. 1, an electrical component 10, such as an integrated circuit or interconnect, is mounted on a printed circuit board 12 with its leads 14 projecting through printed circuit board 12, defining a protruding lead link for the leads. Each hole 16 in printed circuit board 12 is surrounded by a plated solder pad 18 on at least conductor side 20 of printed circuit board 12. Printed circuit board 12 typically includes a solder mask 22 for protecting surfaces, which are to be solder free. According to the present invention, a polymorphic rectilinear thieving pad 24 is disposed adjacent to hole 16.

During wave soldering, a soldering wave 26 is created in a molten solder pool by support plate 28. Wave solder in technologies for creating solder wave 26 are well known to those of ordinary skill in the art. Typically, a conveyer belt (not shown) slides the printed circuit board 12 over a pool of molten solder towards solder wave 26. As printed circuit board 12 is passed through solder wave 26, in the direction of arrow 30, lead 14 contacts solder wave 26, which results in lead 14 being electrically connected to plated solder pad 18. The solder also holds electrical component 10 firmly in place after cooling.

Figure 2:
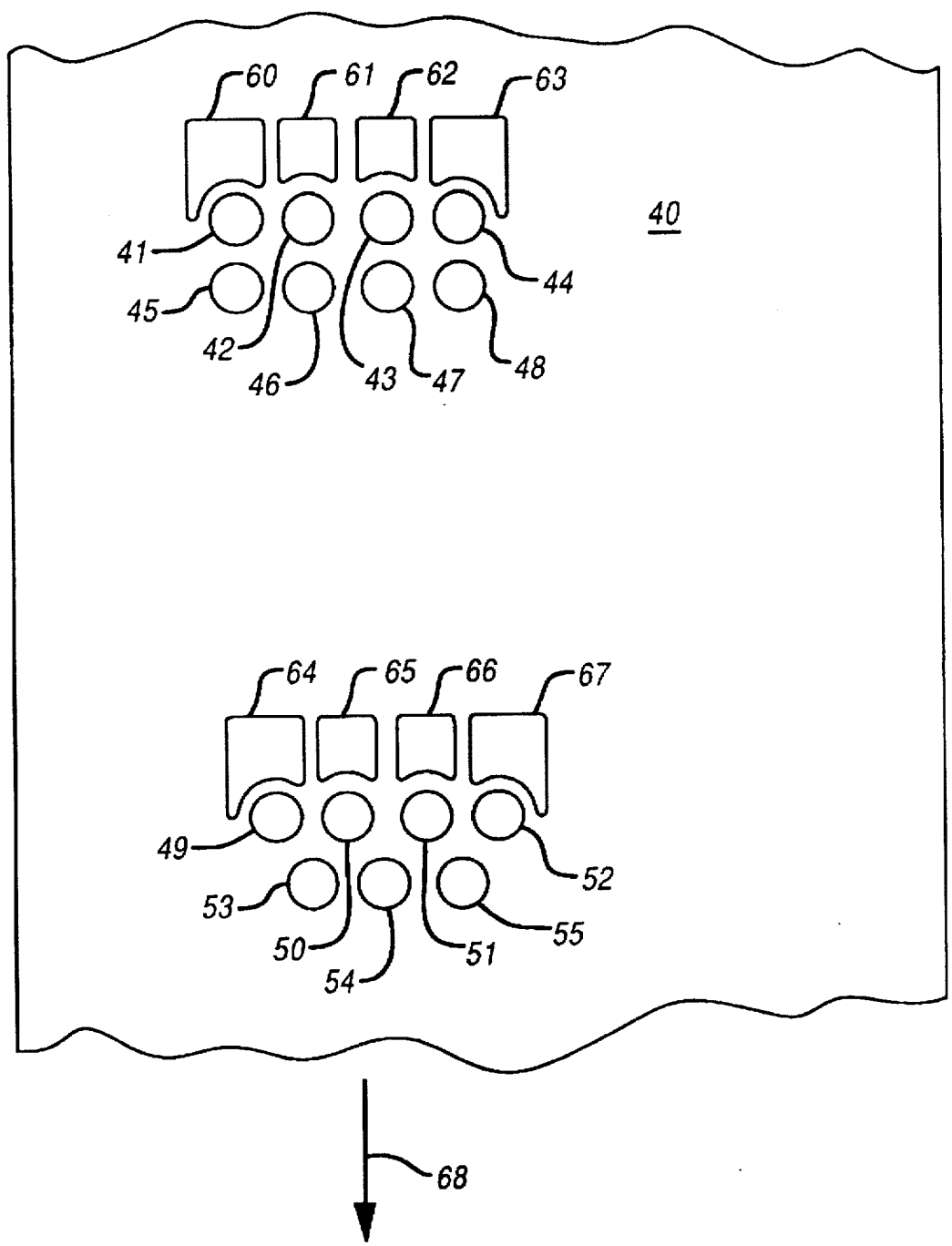
FIG. 2 depicts a portion of a printed circuit board 40 with two arrays of holes and pads.

FIG. 2 depicts a portion of a printed circuit board 40. Illustrated are two arrays of holes in printed circuit board 40. A first group of holes includes holes 41–48 while a second group of holes includes holes 49–55. An integrated circuit may be physically mounted onto printed circuit board 40 via insertion of its leads into the holes. Other devices, such as a connector, also may be mounted on to printed circuit board 40 by inserting the leads of the device into the holes. A wave soldering process is employed to provide electrical connections between the leads and other electrical components (not shown) of printed circuit board 40. Polymorphic rectilinear thieving pads 60–67 are employed to reduce any bridging between leads that might occur during a wave soldering process. As can be seen, pads 60, 63, 64, and 67 are asymmetrical pads while pads 61, 62, 65, and 66 are symmetrical pads. These pads are placed such that they trail the holes in the group that they are associated with when printed circuit board 40 is moved through the wave soldering apparatus in the direction of arrow 68.

As can be seen, polymorphic rectilinear thieving pads 60–67 do not have corners, but instead a curve or an arc having a specified radius is employed in place of verticied corners. A "verticied corner" is a corner that actually includes a vertex. Additionally, the side of each pad closest to a hole also has a curve or an arc following the edge of the hole adjacent to the pad. Asymmetrical pads are employed for pads located at the last hole located on the left or right side of an array of holes. Symmetrical pads are employed for any hole in between the first and last hole in an array of holes. These outside pads are asymmetrical with an increased surface area to the outside or free side of the hole arrays because of the asymmetrical wake that occurs without these pads when an array of leads inserted into the holes goes through a laminar or turbulent solder wave.

The polymorphic rectilinear thieving pads provide an advantage over presently used square or round pads. Presently used pads are the same size or smaller than the area covered by the holes. These types of pads typically do not have enough surface area to pull solder off the pins. A square pad has more area than a hole, but the sharp edges weakens the surface tension on the molten solder. As a result, the amount of solder that can be pulled away from the pins is decreased. In effect, a square shaped pad does not have more or much more surface area than a round pad that is of the same size as a hole.

As can be seen, the present invention increases the surface area of the pads through the shape of the pads, which exclude verticied corners and have an arc that follows the hole with which the pad is associated.

By forming the asymmetrical arm that comes down and around the hole, the solder flow characteristics can be stabilized into a micro laminar environment around the end leads of the device to insure consistent solder thieving from the protruding lead. As a result, environmental conditions that induce solder bridging within and on the through hole pin arrays during the process are minimized.

Figure 3:
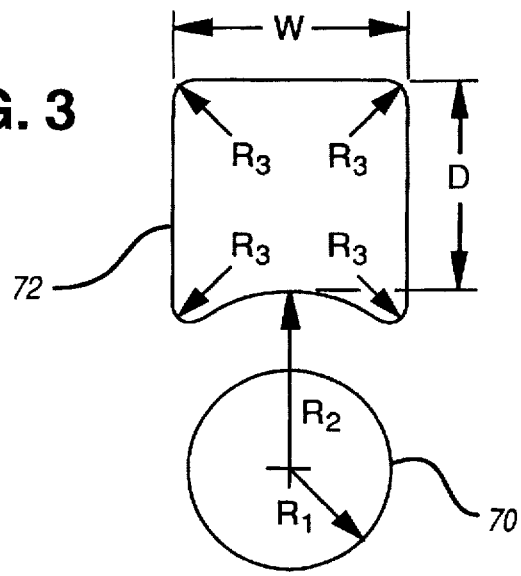
FIG. 3 is an illustration of hole with a pad according to the present invention.

Turning now to FIG. 3, a hole 70 with a pad 72 are depicted according to the present invention. Pad 72 is a symmetrical pad for use with a plated connector through hole that is not on the outside left or right end of an array of holes. Radius $R_1$ is the radius of hole 70 while radius $R_2$ is the radius from the center of hole 70 to the arc in pad 72. Pad 72 has a width W and a length D. Pad 72 has a radius of an arc, radius $R_3$. In particular, radius $R_3$ represents the radius for a fitted arc, also called a "radiused corner". A "radiused corner" is an arc that is described by some radius. In particular, a radiused corner is fit to (1) the intersecting vertical and horizontal line segments or (2) line segment and arc that would otherwise form pad 72. For example, the top side and the right side of pad 72 are connected by a radiused corner, which is defined by radius $R_3$. The right side and the bottom side (the curved side) of pad 72 also are connected by a radiused corner, which is defined by radius $R_3$. The various dimensions for pad 72 in FIG. 3 may be determined as follows:

$$W=2.1(R_1)$$

$$D=2(R_1)$$

$$R_2=1.9(R_1)$$

$$R_3=0.21(R_1)$$

The distance D is measured from the point at which the bottom side of pad 72 intersects line $L_2$ to the top side. Basically, D is the shortest distance from the top side to the arc in the bottom side.

Figure 4:
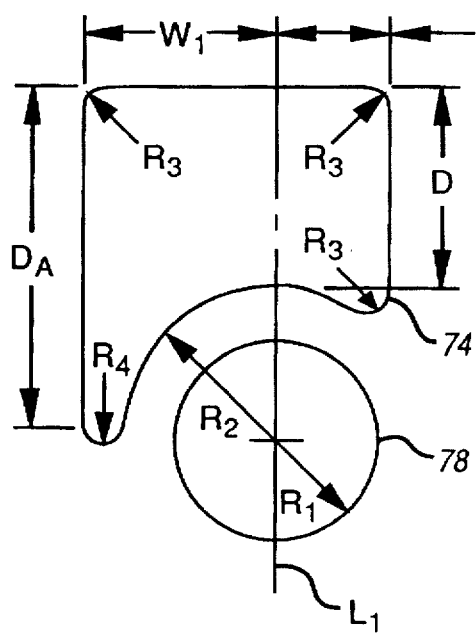
FIGS. 4 and 5 are illustrations of a left asymmetrical pad and a right asymmetrical pad depicted according to the present invention.
Figure 5:
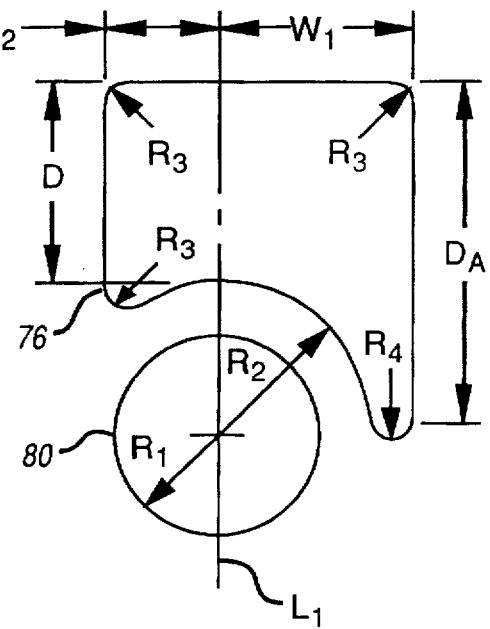

Turning next to FIGS. 4 and 5, a left asymmetrical pad 74 and a right asymmetrical pad 76 are depicted according to the present invention. Holes 78 and 80 are outside holes in an array of holes. Pads 74 and 76 are asymmetrical pads used with holes on the outside portions of an array of holes. The width of pads 74 and 76 are determined by lengths $W_1$ and $W_2$. The left side of pad 74 and the right side of pad 76 each have a length of $D_A$ while the right side of pad 74 and the left side of pad 76 have a length of D. Both pads 74 and 76 have a radius $R_3$ for a radiused corner formed by the intersection of a vertical and horizontal line segment or a line segment and an arc. Additionally, pads 74 and 76 each have a radius $R_4$ for a radiused corner, as can be seen in FIGS. 4 and 5.

The lengths $W_1$ and $W_2$ are measured from a line $L_1$ that is parallel to the segment having a length $D_A$ and the segment having a length D. Line $L_1$ bisects hole 78 in FIG. 4 and hole 80 in FIG. 5. The various dimensions of these two asymmetrical pads may be determined as follows:

$$W=2.1(R_1)$$

$$D=2(R_1)$$

$$R_2=1.9(R_1)$$

$R_3=0.21(R_1)$ $D_A=3.8(R_1)$ $R_4=0.25(R_1)$ $W_1=2.4(R_1)$ $W_2=W/2=1.05(R_1)$ $D_A$ is measured from the beginning of radius $R_4$ to the top edge of pad 74 or 76.

Figure 6:
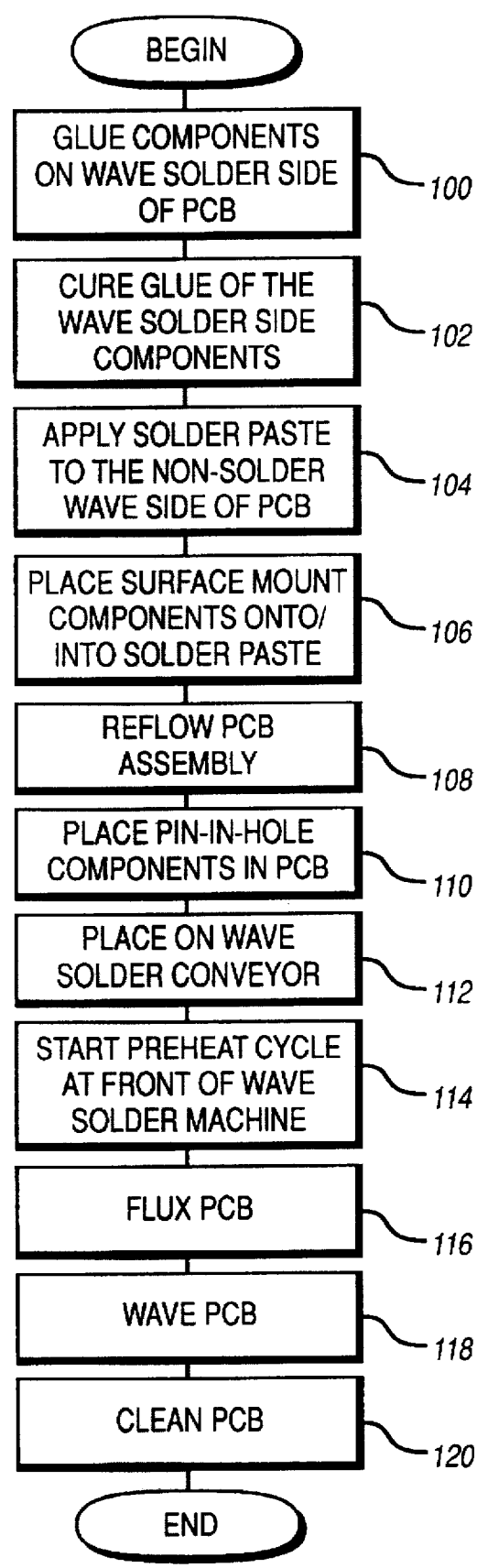
FIG. 6 is an illustration of a process for wave soldering that reduces solder bridging between leads of components of an integrated circuit while simultaneously contacting the leads of the integrated circuit to other layers or surfaces of a printed circuit board.

Turning now to FIG. 6, a process for wave soldering that reduces solder bridges between leads of components of an integrated circuit while simultaneously contacting the leads of the integrated circuit to other layers or surfaces of a printed circuit board is illustrated. The process requires wave solder machinery as shown in FIG. 1 commonly used in the industry such as Electrovert, Inc.

The process for mixed technology boards (boards which have both surface mount and pin-in-hole components) starts with the placement of glue dots on the solder side of the printed circuit board (step 100). The glue dots are used to retain small discrete components such as resistors, capacitors, and small outline integrated circuits (SOIC) to the solder side of the board. After all components are placed on the solder side of the board, it is placed on a conveyor and sent through a glue cure oven to cure the glue (step 102). Once the retention glue spots cure, the board is taken through a solder paste application process to apply solder paste to the surface mount solder pads on the non-wave solder side of the printed circuit board assembly (step 104). Once the solder paste has been applied, the surface mount components are placed on the printed circuit board assembly (step 106). Once the components have been placed, the printed circuit board assembly is placed on a conveyor that carries it through a reflow oven (step 108). The reflow operates at a temperature level that melts or liquefies the solder paste in which the leads of the components are setting. Upon completion of the reflow, the non-solder wave side surface mount components are permanently attached to the printed circuit board assembly. Once this phase of the assembly process is completed, all pin-in-hole components are placed in or on the printed circuit board assembly (step 110).

The printed circuit board assembly is now placed on a conveyor which carries the printed circuit board assembly through a wave solder machine such as the Electrovert Wave Dipper available from Electrovert USA Corp. at 805 TW North Carrier Parkway, Grand Prairie, Tex. 75051-1044 (step 112). Next, the printed circuit board with attached integrated circuits are slowly preheated to avoid thermal shock and damage to the printed circuit board and integrated circuits during the actual wave soldering (step 114). Thereafter, the printed circuit board with the integrated circuits are fluxed or clean in preparation for soldering (step 116). Various fluxes, such as rosin mildly activated flux may be employed. The printed circuit board with attached integrated circuits is then waved soldered with molten solder (step 118). Thereafter, the printed circuit board is cleaned to remove flux from the board (step 120).

A pin-in-hole only printed circuit board assembly would omit the placement of solder side components, glue dots, and non-solder wave side surface components. For pin-in-hole there is only one solder machine process and this is of the wave solder type.

According to the present invention, however, the problems of bridging are reduced or eliminated by the use of the pads according to the present invention as described in FIG. 2-6. The present process avoids solder bridging between the leads of the various integrated circuits while making electrical contacts with other electrical components on the printed circuit board.

The present invention provides a method and apparatus for reducing bridging between leads of integrated circuits during a wave solder process. In particular, the present invention reduces bridging between leads of integrated circuits that are pin-in-hole mounted. The advantages of the present invention are provided by the radii or arcs provided in the pads, eliminating any sharp corners in the pads. The pads also include curved sides that follow the shape of the hole, aiding in the creation of a micro or mini environment to maintain a laminar flow and reduce turbulence. Pseudo laminar flow is produced when the printed circuit board is wave soldered. Additionally, the use of symmetrical pads for holes in the interior of an array of holes and the use of asymmetrical pads for holes on the outside edges of an array of holes further reduces problems with bridging between leads during a wave soldering process.

The pads used in the present invention are hot air solder leveled (HASL) pads. Other pads such as electroplated gold, silver and/or solder, basically, any metal used in solder applications may be employed to create the pads of the present invention.

While the invention has been particularly shown and described with reference to a preferred embodiment, it will be understood by those skilled in the art that various changes in form and detail may be made therein without departing from the spirit and scope of the invention. For example, pads having other shapes then those depicted in the figures may be employed. Such pads could have a different shape, but would include a curved side that is associated with the hole and would avoid the use of corners.

What is claimed is:

1. A printed circuit board defining an array of holes comprising:

a pad associated with a hole in the array of holes, the pad having sides wherein one of the sides is a curved side which extends less than halfway around the hole and is closer to the hole than any of the other sides, the concavity of said curved side facing the hole.

2. The printed circuit board of claim 1, wherein the curved side has a radius proportional to the radius of the hole.

3. The printed circuit board of claim 2, wherein the radius of the curved side is determined as follows:

$R_2=1.9(R_1)$ wherein $R_1$ is the radius of the hole, and $R_2$ is the radius of the curved side.

4. The printed circuit board of claim 3, wherein the pad also includes a first side opposite the curved side, wherein a second side and a third side, opposite each other are located between the curved side and the first side.

5. The printed circuit board of claim 1, wherein the pad includes sides that are connected to each other by radiused corners.

6. A printed circuit board defining an array of holes comprising:

a pad associated with a hole in the array of holes, the pad having at least first and second straight sides, wherein corners of the pad are rounded and the pad includes a third side closer to the hole than any of the other sides, said third side extends less than half way around the hole.

7. The printed circuit board of claim 6, wherein the said third side is located between the first and second straight sides.

8. The printed circuit board of claim 7, wherein the concavity of the third side faces the hole.

9. The printed circuit board of claim 8, wherein the third side has a radius proportional to the radius of the hole.

10. A printed circuit board comprising:

an array of holes defined by the circuit board for receiving leads of an integrated circuit; and a pad associated with a hole in the array of holes, the pad having four exterior sides, a first side, a second side, a third side, and a fourth side, wherein the first, second, and third sides are straight, the fourth side is curved, the third and fourth sides are opposite each other and located between the first and second sides, and wherein the third side is connected to the first side by a first radiused corner and is connected to the second side by a second radiused corner, and the fourth side is connected to the first side by a third radiused corner and is connected to the second side by a fourth radiused corner, the fourth side being closer to the hole than any of the other sides and extending around the hole less than half the circumference of the hole, the concavity of the fourth side facing the hole.

11. The printed circuit board of claim 10, wherein the fourth side is parallel to the perimeter of the hole.

12. The printed circuit board of claim 10, wherein the fourth side has a radius determined utilizing the radius of the hole.

13. The printed circuit board of claim 12, wherein the radius of the first, second, third, and fourth radiused corners are determined utilizing the radius of the hole.

14. The printed circuit board of claim 13, wherein the length of the first, second, and third sides are determined utilizing the radius of the hole.

15. The printed circuit board of claim 14, wherein the pad is symmetric about the line connecting the center of the pad with the center of the hole.

16. The printed circuit board of claim 14, wherein the pad is asymmetric about the line connecting the center of the pad with the center of the hole.

17. The printed circuit board of claim 14, wherein the length of each of said first and second sides is determined as follows:

$$D=2(R_1)$$

wherein D is said length and $R_1$ is the radius of the hole.

18. The printed circuit board of claim 17, wherein the length of the third side is determined as follows:

$$W=2.1(R_1)$$

wherein W is the length of third side and $R_1$ is the radius of the hole.

19. The printed circuit board of claim 12, wherein the fourth side has a radius determined as follows:

$$R_2=1.9(R_1)$$

wherein $R_2$ is the radius of the fourth side and $R_1$ is the radius of the hole.

20. The printed circuit board of claim 14, wherein the length of the first side is determined as follows:

$$D_A=3.8(R_1)$$

wherein $D_A$ is the length of the first side and $R_1$ is the radius of the hole.

21. The printed circuit board of claims 14, wherein the length of the third side is determined as follows:

$$W=3.45(R_1)$$

wherein W is the length of the third side and $R_1$ is the radius of the hole.

22. A printed circuit board assembly comprising:

a printed circuit board defining holes;

a plurality of solder pads located on one side of the printed circuit board, each of the plurality of solder pads for establishing electrical interconnections;

a device including a plurality of leads, each of the plurality of leads being placed in a corresponding one of said holes; and a plurality of pads located at one end of the plurality of solder pads, wherein each of said plurality of pads is associated with one of said holes located at the one end of the plurality of solder pads and has a side that is a curved side closer than any of the other sides to said one of said holes and extends less than half way around the circumference of said one of said holes, and the concavity of said curved side faces said one of said holes wherein, pseudo laminar flow is produced when the printed circuit board is wave soldered.

23. The printed circuit board of claim 20, wherein the device is an integrated circuit.

24. The printed circuit board of claim 20, wherein the device is an interconnect.

25. A method for wave soldering a printed circuit board to inhibit bridging between leads of an integrated circuit mounted on the printed circuit board and for simultaneously making electrical connections between the leads of the integrated circuit and other interconnections of the printed circuit board, the method comprising:

providing a printed circuit board including a first surface, a second surface, and at least one row of holes for receiving leads of an integrated circuit, the at least one row of holes including a first hole and a last hole;

providing a pad located adjacent to the last hole, wherein the pad includes sides that have a curved side closer than any of the other sides to the last hole, wherein the curved side is parallel to the perimeter of the last hole and extends less than half way around said perimeter;

placing the leads of the integrated circuit into the at least one row of holes; and wave soldering the printed circuit board including the leads of the integrated circuit to electrically interconnect the leads to the other interconnections of the printed circuit board while inhibiting solder bridging, the printed circuit board moving in a direction from the first hole to the last hole.

26. A method of manufacturing a printed circuit board comprising the step of providing a pad eccentric with a hole and including a plurality of sides that includes a curved exterior side closer than any other of said plurality of sides to the hole, where the curved side extends around the hole less than one-half the circumference of the hole, the concavity of said curved side facing the hole.

27. A printed circuit board defining at least one hole comprising a pad associated with the at least one hole, said pad having sides one of which is a curved exterior side closer than any other of the sides to the at least one hole and extending less than half-way around the at least one hole, the concavity of said curved side facing the at least one hole.

28. A method of manufacturing a printed circuit board with a hole comprising the step of providing a pad having at least one radiused corner and a plurality of sides that includes a concave exterior side which is closer to the hole than any other said plurality of sides and extends less than half way around the hole, the concavity of said concave exterior side facing the hole.

* * * * *